United States Patent
Wen et al.

(10) Patent No.: US 10,921,855 B1
(45) Date of Patent: Feb. 16, 2021

(54) INTERPOSER FOR A DISPLAY DRIVER INTEGRATED CIRCUIT CHIP

(71) Applicant: SYNAPTICS INCORPORATED, San Jose, CA (US)

(72) Inventors: Shengmin Wen, Phoenix, AZ (US); Qing Xiao, San Jose, CA (US); Jason Goodelle, San Jose, CA (US); Joseph Kurth Reynolds, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/554,826

(22) Filed: Aug. 29, 2019

(51) Int. Cl.
| | |
|---|---|
| *G06F 1/16* | (2006.01) |
| *G09G 3/3275* | (2016.01) |
| *G09G 3/36* | (2006.01) |
| *H01L 25/16* | (2006.01) |
| *G02F 1/1333* | (2006.01) |

(52) U.S. Cl.
CPC ........ *G06F 1/1643* (2013.01); *G02F 1/13338* (2013.01); *G09G 3/3275* (2013.01); *G09G 3/3685* (2013.01); *H01L 25/167* (2013.01)

(58) Field of Classification Search
CPC .. G06F 1/1643; G09G 3/3275; G09G 3/3685; G09G 2310/0275; G09G 2370/08
See application file for complete search history.

(56) References Cited

U.S. PATENT DOCUMENTS

| | | | | |
|---|---|---|---|---|
| 2015/0130782 | A1* | 5/2015 | Amino | G09G 3/20 345/213 |
| 2016/0071478 | A1* | 3/2016 | Takahashi | G09G 3/3696 345/212 |
| 2017/0047001 | A1* | 2/2017 | Shin | G09G 3/3688 |
| 2017/0229060 | A1* | 8/2017 | Sakamaki | G09G 3/3648 |
| 2019/0051337 | A1* | 2/2019 | Jo | G09G 3/20 |

* cited by examiner

*Primary Examiner* — Michael Pervan
(74) *Attorney, Agent, or Firm* — Ferguson Braswell Fraser Kubasta PC

(57) ABSTRACT

A semiconductor assembly for a display device comprises a display driver integrated circuit (DDIC) chip and an interposer coupled to the DDIC chip. The DDIC chip comprises a plurality of output pads and a plurality of input pads. Further, the DDIC chip is configured to drive a plurality of data lines of the display device to update an active region of the display device. The interposer comprises a plurality of output pads coupled to the plurality of output pads of the DDIC chip and is configured to be coupled to the plurality of data lines of the display device. The interposer further comprises a plurality of input pads coupled to the plurality of input pads of the DDIC chip pads. Further, a width of the interposer is at least as large as a distance between outermost data lines of the plurality of data lines.

20 Claims, 9 Drawing Sheets

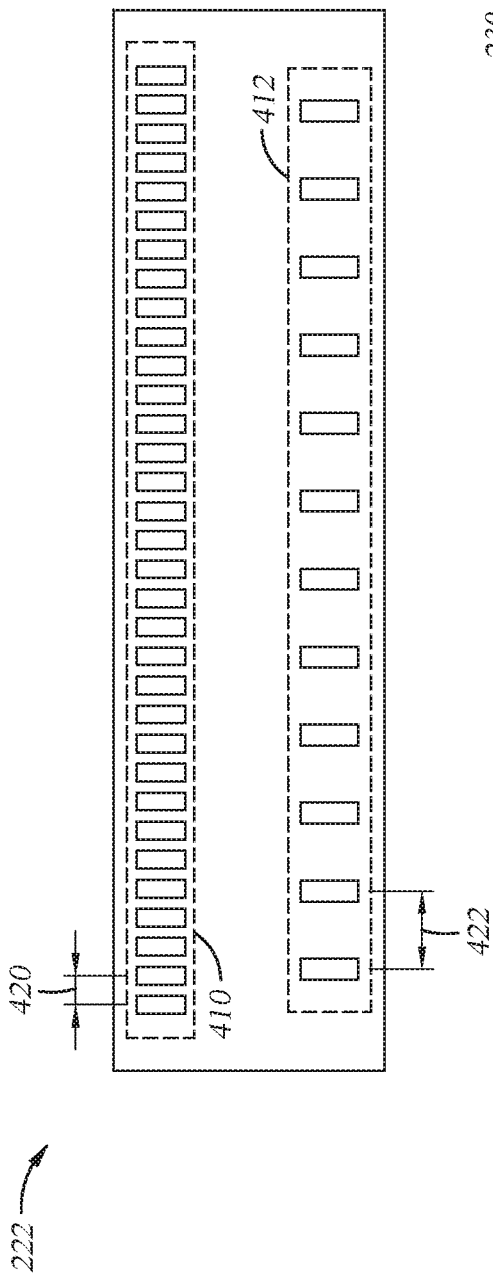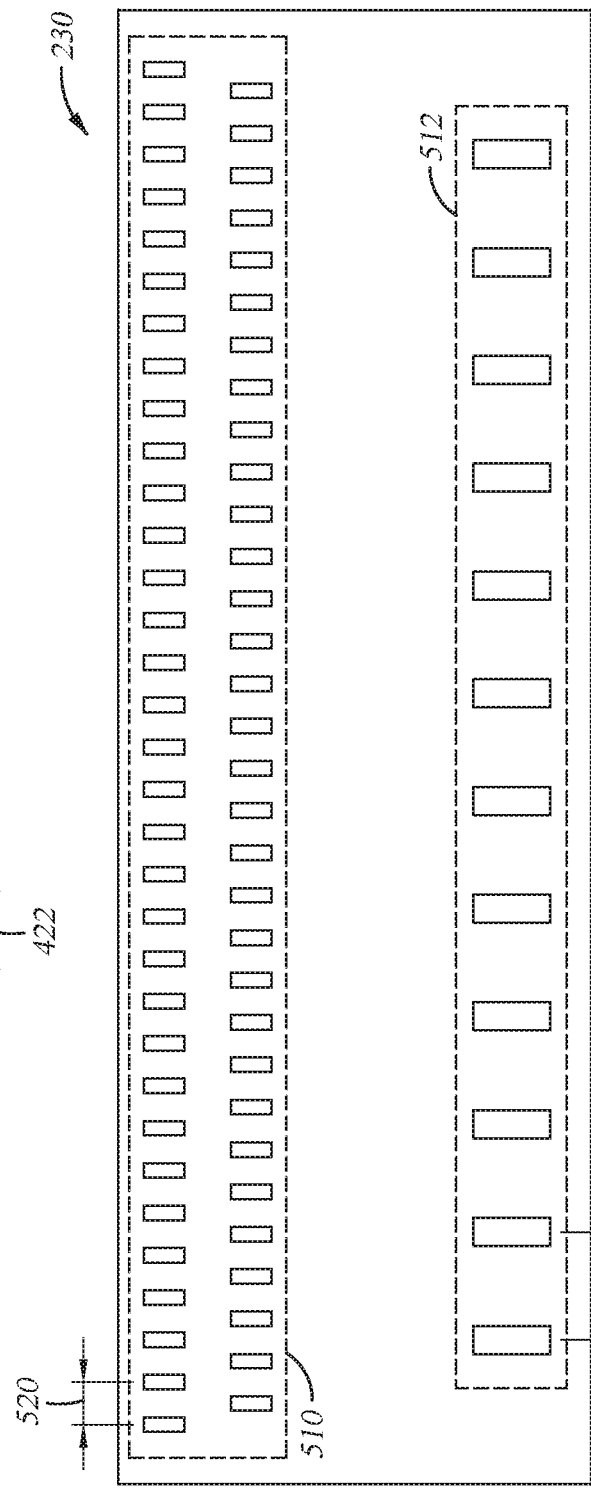

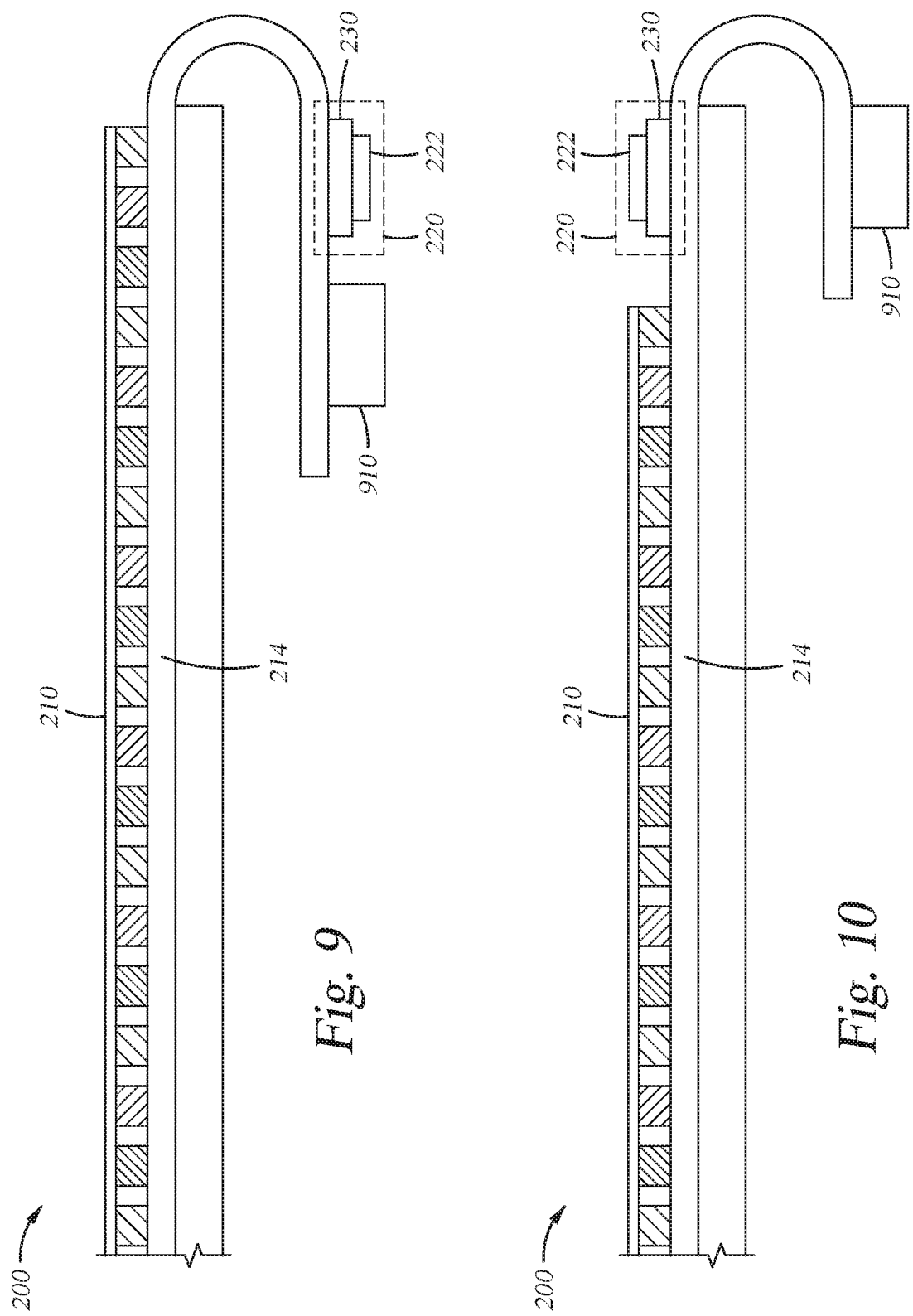

INTERPOSER FOR A DISPLAY DRIVER INTEGRATED CIRCUIT CHIP

BACKGROUND

Field

The disclosure herein is generally related to electronic devices, and more specifically, to mounting display driver integrated circuit chips in a display device.

Description of the Related Art

Input devices including proximity sensor devices may be used in a variety of electronic systems. A proximity sensor device may include a sensing region, demarked by a surface, in which the proximity sensor device determines the presence, location, force and/or motion of one or more input objects. Proximity sensor devices may be used to provide interfaces for the electronic system. For example, display integrated proximity sensor devices may be used as input devices for larger computing systems, such as touchscreens integrated in, or peripheral to, notebook or desktop computers. Display integrated proximity sensor devices may also often be used in smaller computing systems, such as touch screens integrated in cellular phones. Additionally, proximity sensor devices may be implemented as part of a multimedia entertainment touchscreen system of an automobile.

SUMMARY

In one embodiment, a display device comprises a display panel and a semiconductor assembly. The display panel comprises a plurality of subpixels defining an active region of the display panel, a substrate, and a plurality of data lines. The plurality of data lines is disposed within one or more layers of the substrate and coupled to the plurality of subpixels. The semiconductor assembly comprises a display driver integrated circuit (DDIC) chip comprising a plurality of output pads and a plurality of input pads. The semiconductor assembly further comprises an interposer coupled to the DDIC and mounted to the substrate. The interposer comprises a plurality of output pads and a plurality of input pads. The plurality of output pads is coupled to the plurality of output pads of the DDIC and to the plurality of data lines. The plurality of input pads is coupled to the plurality of input pads of the DDIC. Further, a width of the interposer is at least as large as a distance between outermost data lines of the plurality of data lines.

In one embodiment, a semiconductor assembly comprises a display driver integrated circuit (DDIC) chip and an interposer coupled to the DDIC chip. The DDIC chip comprises a plurality of output pads and a plurality of input pads and is configured to drive a plurality of data lines of a display device to update an active region of a display device. The interposer comprises a plurality of output pads coupled to the plurality of output pads of the DDIC and is configured to be coupled to the plurality of data lines of the display device. The interposer further comprises a plurality of input pads coupled to the plurality of input pads of the DDIC pads. Further, a width of the interposer is at least as large as a distance between outermost data lines of the plurality of data lines.

In one embodiment, an interposer for a display device comprises a plurality of output pins and a plurality of input pads. The plurality of output pins is configured to couple to a plurality of output pads of a display driver integrated circuit (DDIC) chip configured to drive a plurality of data lines to update an active region of a display device. The plurality of output pins is further configured to couple to the plurality of data lines of the display device. The plurality of input pads is configured to couple to a plurality of input pins of the DDIC. Further, a width the interposer is at least as large as large as a distance between outermost data lines of the plurality of data lines.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 4 is a schematic block diagram of an integrated circuit chip, according to one or more embodiments.

FIG. 5 is a schematic block diagram of an interposer, according to one or more embodiments.

FIGS. 9, 10, 11, and 12 are schematic block diagrams of a display device, according to one or more embodiments.

Figure 1:
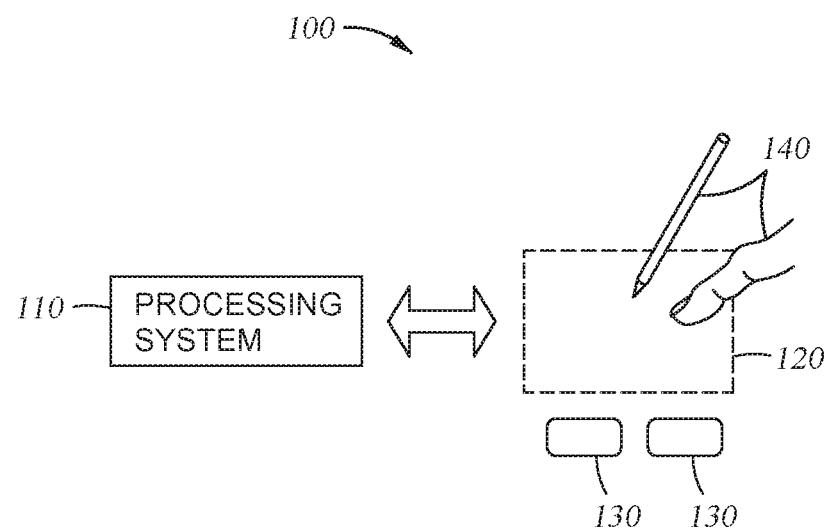
FIG. 1 illustrates an example input device, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

An example input device 100 as shown in FIG. 1 in accordance with embodiments of the disclosure may be configured to provide input to an electronic system. As used in this document, the term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, personal digital assistants (PDAs) and multi-media entertainment devices of automobiles. Additional example electronic systems include composite input devices, such as physical keyboards that include input device 100 and separate joysticks or key switches. Further example electronic systems include peripherals such as data input devices, e.g., remote controllers and mice, and data output devices, e.g., display screens and printers. Other examples include remote terminals, kiosks, video game machines, e.g., video game consoles, portable gaming devices, multi-media entertainment devices of an automobile, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device.

The input device 100 can be implemented as a physical part of the electronic system, or can be physically separate from the electronic system. In one embodiment, the electronic system may be referred to as a host device. As appropriate, the input device 100 may communicate with parts of the electronic system using any one or more of the following: buses, networks, and other wired or wireless interconnections. Examples include $I^2C$, SP1, PS/2, Universal Serial Bus (USB), Bluetooth, RF, and IRDA.

In FIG. 1, the input device 100 is shown as a proximity sensor device configured to sense input provided by one or more input objects 140 in a sensing region 120. Example input objects 140 include fingers and styli, as shown in FIG. 1. An exemplary proximity sensor device may be a touchpad, a touch screen, a touch sensor device and the like. In one or more embodiments, the proximity sensor may be integrated as part of a display of the input device 100. For example, in embodiments, where the proximity sensor device is a touch screen, the proximity sensor may be integrated as part of a display of the input device 100.

The sensing region 120 encompasses any space above, around, in and/or near the input device 100 in which the input device 100 is able to detect user input, e.g., user input provided by one or more input objects 140. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiment's sense input that comprises: no contact with any surfaces of the input device 100; contact with an input surface, e.g., a touch surface, of the input device 100: contact with an input surface of the input device 100 coupled with some amount of applied force or pressure; and/or a combination thereof. In various embodiments, input surfaces may be provided by surfaces of casings within which the sensor electrodes (also referred to herein as sensing electrodes) reside, by face sheets applied over the sensor electrodes or any casings, etc. In some embodiments, the sensing region 120 has a rectangular shape when projected onto an input surface of the input device 100. An input object that is not in contact with any surfaces of the input device 100 may be referred to as a hovering input object.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images (e.g., of capacitive signals) that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (also often referred to as "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g., system ground, and by detecting the capacitive coupling between the sensor electrodes and input objects. In some implementations sensing elements may be formed of a substantially transparent metal mesh (e.g., a reflective or absorbing metallic film patterned to minimize visible transmission loss from the display sub-pixels). Further, the sensor electrodes may be disposed over a display of a display device. The sensing electrodes may be formed on a common substrate of a display device (e.g., on the encapsulation layer of a rigid or flexible organic light emitting diode (OLED) display. An additional dielectric layer with vias for a jumper layer may also be formed of a substantially transparent metal mesh material (e.g., between the user input and an OLED cathode). The jumpers of the jumper layer may be coupled to the electrodes of a first group and cross over sensor electrodes of a second group.

Some capacitive implementations utilize "mutual capacitance" (also often referred to as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also referred to herein as "transmitter electrodes" or "transmitters") and one or more receiver sensor electrodes (also referred to herein as "receiver electrodes" or "receivers"). The coupling may be reduced when an input object coupled to a system ground approaches the sensor electrodes. Transmitter sensor electrodes may be modulated relative to a reference voltage, e.g., system ground, to transmit transcapacitive sensing signals. Receiver sensor electrodes may be held substantially constant relative to the reference voltage or modulated relative to the transmitter sensor electrodes to facilitate receipt of resulting signals. A resulting signal may comprise effect(s) corresponding to one or more transcapacitive sensing signals, and/or to one or more sources of environmental interference, e.g., other electromagnetic signals. Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) chips and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (in another embodiment, with associated firmware) separate from the central processing unit. As another example, the input device 100 may be physically integrated in a phone, and the processing system 110 may comprise circuits and firmware that are part of a main processor (e.g., a mobile device application processor or any other central processing unit) of the phone. In some embodiments, the processing system 110 is dedicated to implementing the input device 100. In other embodiments, the processing system 110 also performs other functions, such as operating display screens, driving haptic actuators, etc. For example, in one or more embodiments, the processing system 110 may be configured to function as a display driver for a display screen.

The processing system 110 may be implemented as a set of modules that handle different functions of the processing system 110. Each module may comprise circuitry that is a part of the processing system 110, firmware, software, or a combination thereof. In various embodiments, different combinations of modules may be used.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system, e.g., to a central processing system of the electronic system that is separate from the processing system 110, if such a separate central processing system exists. In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120 (e.g. sensor data lines). The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. The filtering may comprise one or more of demodulating, sampling, weighting, and accumulating of analog or digitally converted signals (e.g., for FIR digital or IIR switched capacitor filtering) at appropriate sensing times. The sensing times may be relative to the display output periods (e.g., display line update periods or blanking periods). As yet another example, the processing system 110 may subtract or otherwise account for a baseline, such that the information reflects a difference between the electrical signals from user input and the baseline signals. A baseline may account for display update signals (e.g., subpixel data signal, gate select and deselect signal, or emission control signal) which are spatially filtered (e.g., demodulated and accumulated) and removed from the lower spatial frequency sensing baseline. Further, a baseline may compensate for a capacitive coupling between the sensor electrodes and one or more nearby electrodes. The nearby electrodes may be display electrodes, dummy sensor electrodes, and or other conductive objects that may be capacitively coupled with the sensor electrodes. Additionally, the baseline may be compensated for using digital or analog means. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of a display screen. For example, the sensing region 120 may overlap at least a portion of an active area of a display screen (or display panel). The active area of the display panel may correspond to a portion of the display panel where images are updated. In one or more embodiments, the input device 100 may comprise substantially transparent sensor electrodes overlaying the display screen and provide a touch screen interface for the associated electronic system. The display panel may be any type of dynamic display capable of displaying a visual interface to a user, and may include any type of light emitting diode (LED), OLED, cathode ray tube (CRT), liquid crystal display (LCD), plasma, electroluminescence (EL), or other display technology. The input device 100 and the display panel may share physical elements. For example, some embodiments may utilize some of the same electrical components for displaying and sensing. As another example, the display panel may be operated in part or in total by the processing system 110.

It should be understood that while many embodiments of the disclosure are described in the context of a fully functioning apparatus, the mechanisms of the present disclosure are capable of being distributed as a program product, e.g., software, in a variety of forms. For example, the mechanisms of the present disclosure may be implemented and distributed as a software program on information bearing media that are readable by electronic processors, e.g., non-transitory computer-readable and/or recordable/writable information bearing media readable by the processing system 110. Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
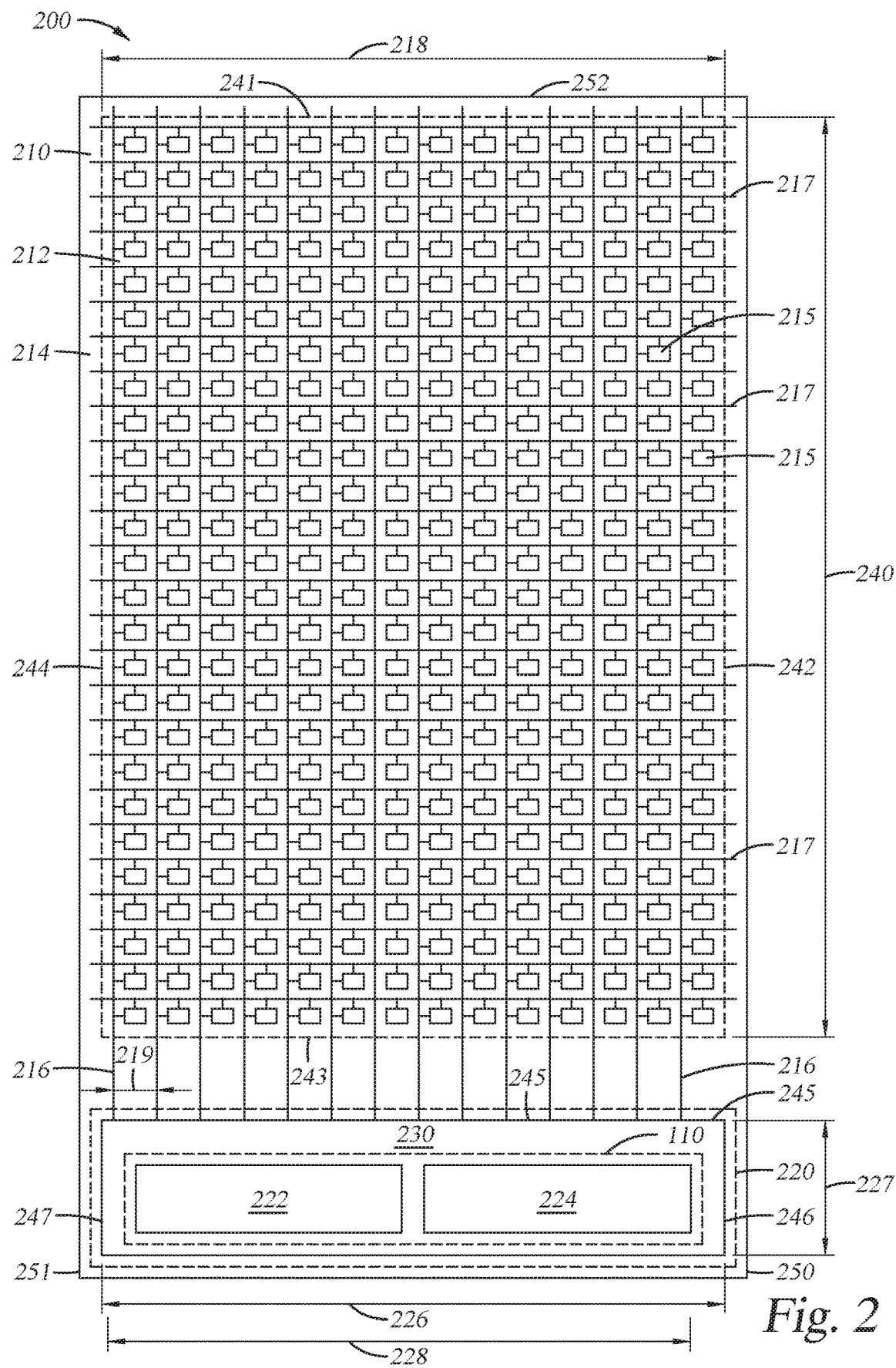
FIG. 2 is a schematic block diagram of an example display device, according to one or more embodiments.

FIG. 2 illustrates a display device 200, according to one or more embodiments. The display device 200 includes a display panel 210, and a semiconductor assembly 220. In one embodiment, the display device 200 is part of the input device 100.

In various embodiments, the display panel 210 is an organic light emitting diode (OLED) display. In other embodiments, the display panel 210 may be other types of displays. For example, the display panel 210 may be one of a light emitting diode (LED), cathode ray tube (CRT), liquid crystal display (LCD), plasma, electroluminescence (EL), micro OLED or other display technology.

The display panel 210 includes subpixels 215, gate lines 217, data lines 216 and substrate 214. Further, the display panel 210 includes an active region 212. The active region 212 corresponds to a region of the display panel 210 where an image is updated. In one or more embodiments, the active region 212 corresponds to the region of the display panel 210 where the subpixels 215 are disposed. Further, the active region 212 has a width 218. The width 218 may correspond to a distance between outermost subpixels 215 of the display panel 210. For example, the width 218 may be defined as a distance between a subpixel 215 or a column of subpixels 215 adjacent the edge 244 of the active region 212 and a subpixel 215 or a column of subpixels 215 adjacent the edge 242 of the active region 212.

The subpixels 215 may include subpixels of different types. For example, the subpixels 215 may include red subpixels, green subpixels and blue subpixels. Additionally, the subpixels 215 may include subpixels of other colors. In one or more embodiments, where optical proximity sensors are included in the display, data lines may include connections through thin-film-transistor (TFT) switches to photo-sensors (e.g. photodiodes or phototransistors) which respond to local illumination and/or reflection with voltage, charge, or current. The voltage, charge, or current of the photosensor may be sensed by sensing circuitry within the processing system 110.

The subpixels 215 are grouped to form pixels. The subpixels 215 may be disposed in various orderings, e.g., layouts, to form the pixels. For example, the subpixels 215 may be configured such that each pixel comprises a subpixel layout of a red subpixel, a green subpixel, and a blue subpixel. A subpixel layout consisting of a red subpixel, a green subpixel and a blue subpixel may be referred to as an RGB subpixel layout. Alternatively, the subpixels 215 may be configured such that each pixel comprises a subpixel layout of a red subpixel, a first green subpixel, a blue subpixel, and a second green subpixel. Further, the subpixels 215 may be configured such that each pixel comprises a subpixel layout of a red subpixel, a first green subpixel, a second green subpixel, and a blue subpixel. In other embodiments, other subpixels layouts may be utilized.

Each subpixel 215 is coupled to a gate line 217 and a data line (e.g., data or source electrode) 216. In one embodiment, the gate lines 217 are coupled to one or more subpixels 215 arranged in a common row. In one or more embodiments, at least two gate lines 217 are coupled to a subpixel of a common row. In various embodiments, the subpixels 215 forming a display row may be referred to as a display line. In one or more embodiments, the display rows and columns may form a "zig-zag" pattern to ensure that the fill density of the subpixels is uniform.

Each of the subpixels 215 includes subpixel circuitry. The subpixel circuitry may include one or more transistors configured to control the activation and deactivation of each subpixel 215. Further, the subpixel circuitry may control current flow through each subpixel 215 to update the subpixels 215. The subpixel circuitry for each subpixel 215 is coupled to a corresponding gate line 217, data line 216 and pixel electrode (not illustrated).

Each of the data lines 216 is coupled to a column of subpixels 215. In one embodiment, each of the data lines 216 is coupled to each subpixel 215 of a common column of subpixels 215. In various embodiments, the data lines 216 may be disposed with a pitch of 219. In one or more embodiments, the pitch 219 may be the same between each data line 216 or the pitch 219 between a first pair of data lines 216 may differ from the pitch of a second pair of data lines 216. Additionally, the data lines 216 may have a width 228. The width 228 may be a distance between outermost data lines 216. For example, the width 228 may be a distance between a data line 216 adjacent the edge 251 of the display device 200 and a data line 216 adjacent the edge 250 of the display device 200. Further, the width 228 may be a distance between a data line 216 associated with a subpixel or a column of subpixels 215 adjacent the edge 244 of the active region 212 and a data line 216 associated with a subpixel or a column of subpixels 215 adjacent the edge 242 of the active area 212. The width 228 of the data lines 216 may be less than, greater than or equal to the width 218 of the active region 212.

In many embodiments, respective ones of the gate lines 217 and respective ones of the data lines 216 cross one another proximate each subpixel 215. Further, connections between each subpixel 215 and a respective gate line 217 and/or a respective a data line 216 may alternate on either side of a common column or display row. In one or more embodiments, a connection between one or more subpixels 215 and a gate line 217 may cross one or more other gate lines 217.

The substrate 214 may be rigid or flexible. For example, the substrate 214 may be one of a glass substrate or a plastic substrate, among others. In other embodiments, the substrate 214 is flexible and at least a portion of the substrate 214 is attached to a rigid support. Further, a portion of the substrate 214 may be folded and positioned below a portion of the display device 200. Further, the gate lines 217 and the data lines 216 may be disposed on or within one or more layers of the substrate 214.

The display panel 210 may additionally include a common voltage electrode (Vcom electrode) or a cathode electrode. The Vcom electrode may be formed from a single electrode or multiple electrodes. Further, the Vcom electrode functions as a reference against which the subpixels 215 are driven for updating. For example, a difference in voltage between a subpixel electrode of each of the subpixels 215 and the Vcom electrode determines the brightness of each subpixel 215. The cathode electrode may be a solid sheet of resistive material that overlaps one or more of the subpixels 215. The cathode electrode may be coupled with and driven by the processing system 110. In one embodiment, the difference in voltage between the cathode electrode and the anode electrode of each subpixel 215 corresponds to the amount of light that is emitted by each of the subpixels 215.

In various embodiments, the display panel 210 may include additional electrodes such as power supply electrodes, and/or emission control electrodes. The power supply electrodes may supply one or more power supply voltages to the display panel 210. Further, each of the emission control electrodes may be coupled to respective one of the subpixels 215 and is configured to control an emission period (e.g., period during which each subpixel 215 emits light). In one embodiment, the emission control electrodes may be disposed parallel to the gate lines 217. Further, the emission control electrodes may be controlled by emission control circuitry.

The semiconductor assembly 220 includes the processing system 110 and an interposer 230. The processing system 110 includes a display driver integrated circuit (DDIC) chip 222. In one embodiment, the DDIC chip 222 may be referred to as a DDIC chip. The processing system 110 may additionally include optional IC chip 224. In other embodiments, the processing system 110 includes additional IC chips, such that the total number of IC chips within the processing system 110 is greater than two. In one embodiment, the DDIC chip 222 may be a TDDI (Touch Display Driver IC chip) where input sensing circuitry and display driver circuitry are integrated onto the same IC chip.

The DDIC chip 222 is configured to drive the data lines 216 to update the active region 212 of the display panel 210 and may be configured to sense data from a portion of data lines. In one embodiment, the DDIC chip 222 drives data signals onto the data lines 216 to update the subpixels 215. The data signals may be voltage signals. For example, the data signals may be between about −2 V and about 10 V. In other embodiments, other voltages may be utilized. The DDIC chip 222 may further provide instructions and/or gate select signals to gate control circuitry (not shown) to activate and/or deactivate the subpixels 215 for updating to update an image displayed by the display device 200. The DDIC chip 222 may also receive image data from an external process. The DDIC chip 222 may process the image data to generate the data signals driven on the data lines.

The DDIC chip 222 may include circuitry configured to drive the data lines 216 with the data signals. For example, the DDIC chip 222 may include one or more source drivers configured to be coupled to the data lines 216. In one or more embodiments, each source driver may be coupled to a different data line 216. In one or more embodiments, the DDIC chip 222 includes sensing circuitry coupled to sensing data lines to receive sensing signals (e.g. optical or capacitive). The DDIC chip 222 may additionally include a receiver interface configured to receive the display data. For example, the receiver interface may be a Mobile Industry Processor Interface (MIPI). In other embodiments, other interfaces may be utilized. Further, the DDIC chip 222 may include one or more of power supply circuitry, gate driver circuitry, emission control driver circuitry, image processing circuitry, and a memory buffer, among others.

The DDIC chip 222 may drive the data lines 216 with data signals to update the subpixels 215 and a corresponding displayed image within the active region 212 during each display frame. In one embodiment, the display frames may be updated, or refreshed, once about every 16 ms, generating a display refresh rate of 60 Hz. In other embodiments, other display refresh rates may be employed. For example, the display refresh rate may be 90, 210 Hz, 240 Hz, or utilized.

In one or more embodiments, the DDIC chip 222 may generate timing signals such as a vertical sync (VSYNC) signal to start and/or end a display frame. The VSYNC signal may indicate a selection of the gate lines 217 and subpixels 215 for display updating. In one embodiment, the VSYNC signal may additionally or alternatively identify one or more vertical blanking periods within a display frame.

In various embodiments, the DDIC chip 222 may be configured to generate a timing signal such as a horizontal sync (HSYNC) signal that corresponds to the start of a display line update period and/or to an end of a display line update period. In one embodiment, the horizontal sync signal may additionally or alternatively identify one or more blanking periods that correspond to a display line update period.

In one embodiment, the DDIC chip 222 utilizes a timing signal such as a display enable signal that may be a composite signal of both the HSYNC and VSYNC signals.

In one embodiment, the gate lines 217 are driven with gate select and gate deselect signal to select (active) and deselect (deactivate) the subpixels 215 for updating. The gate select signal may be referred to a gate high signal or $V_{GH}$ and the gate de-select signal may be referred to a gate low signal or $V_{GL}$. Further, $V_{GH}$ and $V_{GL}$ correspond to the turn-on and turn-off voltages of the transistors of the subpixels configured to control activation and deactivation of the subpixels. In one embodiment, $V_{GH}$ is a positive voltage and $V_{GL}$ is a negative voltage. For example, $V_{GH}$ may be about 15 V and $V_{GL}$ may be about −10 V. However, in other embodiments, other voltages may be used.

In one embodiment, the display driver circuitry of the DDIC chip 222 is configured to process display data to generate the data signals that are driven on the subpixels 215 by the source drivers to update the active region 212 of the display panel 210. For example, the DDIC chip 222 may be configured to receive the display data, decompress the display data, and process the decompressed display data to generate the data signals. In various embodiments, processing the display data includes one or more of scaling the display data, performing image process on the display data, and adjusting the gamma levels of the display data.

In one embodiment, the IC chip 224 may be a memory device. For example, the IC chip 224 may be a flash memory. In other embodiments, the IC chip 224 may be other types of memory devices. In one or more embodiments, the IC chip 224 is a digital IC chip and the DDIC chip 222 is a source driver IC chip. In such an embodiment, the IC chip 224 may generate and provide the data signals to the DDIC chip 222, and the DDIC chip 222 may drive the subpixels 215 with the data signals to update the active region 212 of the display panel 210. In various embodiments, the IC chip 224 may be a display driver IC chip configured similar to that of the DDIC chip 222. In other embodiments, the IC chip 224 may be configured for capacitive or optical sensing, as will be described later. For example, in one embodiment, the IC chip 224 may be a discrete touch (or input sensing) controller. Further, in one or more embodiments, while the processing system 110 is depicted as comprising the DDIC chip 222 and the IC chip 224, the processing system 110 may include additional IC chips. For example, the processing system 110 may include three or more IC chips.

In various embodiments, one or more of the DDIC chip 222 and the IC chip 224 of the processing system 110 are mounted to the interposer 230 forming the semiconductor assembly 220. The interposer 230 may be formed from an organic material or a silicon material. The interposer 230 is mounted to the substrate 214 and communicatively couples the DDIC chip 222 and/or the IC chip 224 to data lines 216 and other display elements of the display device 200. Additionally, the interposer 230 may communicatively couple the DDIC chip 222 with the IC chip 224. In one embodiment, the interposer 230 is mounted to the substrate 214 such that the edge 245 of the interposer 230 is adjacent to edge 243 of the active region 212. Further, the edge 245 of the interposer 230 may be about 500 um from the edge 243 of the active region 212. In other embodiment, the edge 245 of the interposer may be less than or greater than 500 um from the edge 243 of the active region 212.

The interposer 230 has a width 226. In one embodiment, the width 226 of the interposer 230 is the same as the width 218 of the active region 212. In other embodiments, the width 226 of the interposer 230 is larger than the width 218 of the active region 212. In one embodiment, the width 226 of the interposer 230 is less than the width 218 of the active region 212. In one or more embodiments, the width 226 of the interposer 230 is larger than the width 228 of the data lines 216. For example, the edge 246 of the interposer 230 extends outside a first outermost one of the data lines 216 and the edge 247 of the interposer 230 extends outside a second outermost one of the data lines 216. In one embodiment, the edge 246 of the interposer 230 extends outside a data line 216 adjacent the edge 242 of the active region 212 and the edge 247 of the interposer 230 extends outside a data line 216 adjacent the edge 244 of the active region 212. In one embodiment, the width 226 of the interposer 230 is less than the width 218 of the active region 212 and larger than the width 228 of the data lines 216. In one or more embodiments, the width 226 of the interposer 230 is larger than a width of a typical integrated circuit and up to the width of a mobile display interface film. For example the width 226 of the interposer 230 is in range from about 33 mm to about 70 mm. However, the width 226 of the interposer 230 may be greater than about 70 mm.

In various embodiments, the width 226 of the interposer 230 is at least 30 mm. Further, the width 226 of the interposer 230 is wider than the combined width of the data lines 216. In one or more embodiments, the width 226 of the interposer 230 is at least 32 mm. In one or more embodiments, the aspect ratio of the width 226 to the length 227 of the interposer 230 is at least about 30 to about 1. Alternatively, the aspect ratio of the interposer 230 may be greater than about 30 to about 1 or less than about 30 to about 1.

In various embodiments, as the width 226 of the interposer 230 is at least as large as the width 218 of the active region 212 and/or the width 228 of the data lines 216, connections can be formed between the interposer 230 and the data lines 216 without the use of a fan-out region. That is, without fanning out of the routing coupling the data lines 216 with the interposer 230. Accordingly, the length of each of the data lines 216 is substantially similar. For example, the length of each of the data lines 216 is within manufacturing tolerances of the length of each other. Further, the length of each of data lines 216 is substantially similar such that the resistance of each data line 216 is within a manufacturing tolerance of the resistance of each other data line 216. Accordingly, as the length of all of the data lines 216 is substantially the same, any differences in resistance between the data lines 216 is mitigated and/or eliminated. Additionally, the pitch 219 between each data line 216 may be consistent along the length of each data line 216. Thus, the need to add costly resistance balancing elements to the data lines 216 of the DDIC chip 222 is eliminated, reducing the cost of the display device 200, while simplifying and reducing manufacturing costs.

In one or more embodiments, the DDIC chip 222 and/or the IC chip 224 may be tested for proper functionality before they are mounted to the interposer 230. Further, in one embodiment, the semiconductor assembly 220 may be tested for proper functionality after the DDIC chip 222 and/or the IC chip 224 are mounted to the interposer 230.

In one embodiment, the interposer 230 is mounted to the substrate 214 through the use of a bonding head that includes one or more cutouts sized and located according to the size and location of at least one of the DDIC chip 222 and the IC chip 224. Further, when the bonding head contacts the interposer 230 to mount the interposer to the substrate 214, the DDIC chip 222 and/or the IC chip 224 are not substantially contacted by the bonding head. In various embodiments, as the bonding pads of the interposer 230 are located along the perimeter of the interposer 230, utilizing a bonding head comprising cutouts ensures that at least a majority of the pressure applied to bond the interposer 230 to the substrate 214 is applied to the bonding pads of the interposer 230. For example, FIG. 5 illustrates an embodiment where the bonding pads 510 and 512 are disposed around the perimeter of the interposer 230. In one embodiment, the substrate 214 is glass and mounting the interposer to the substrate 214 may be referred to as chip on glass (COG) mounting. In another embodiment, the substrate 214 is plastic and mounting the interposer to the substrate 214 may be referred to as chip on plastic (COP) mounting. In other embodiments, the substrate 214 is a film and mounting the interposer to the substrate 214 may be referred to as chip on film (COF) mounting.

Figure 3:
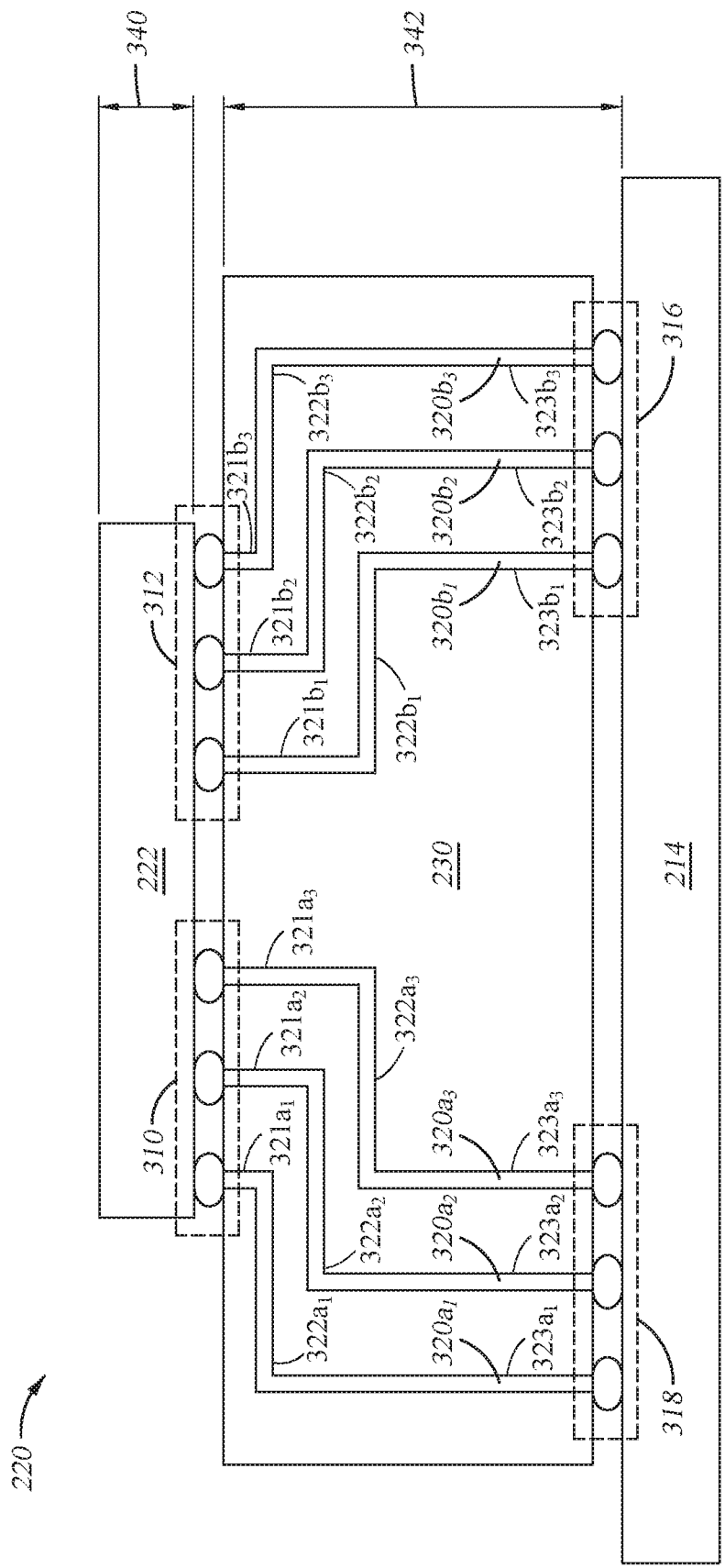
FIG. 3 is a schematic block diagram of an example semiconductor assembly, according to one or more embodiments.

FIG. 3 illustrates a schematic view of a cross-section of the semiconductor assembly 220, according to one or more embodiments. The semiconductor assembly 220 includes the DDIC chip 222 and an interposer 230. In various embodiments, the semiconductor assembly 220 includes additional IC chips, e.g., IC chip 224. The DDIC chip 222 is coupled to the interposer 230 with connections 310 and connections 312. Further, the interposer 230 is coupled to the substrate 214 with connections 318 and 316.

The connections 310 may be connected to a receiver interface of the DDIC chip 222. Further the connections 312 may be coupled to one or more of source drivers and other output circuitry of the DDIC chip 222. The connections 318 may be coupled to a host processor via traces disposed on the substrate 214. Further, the connections 316 may be coupled to data lines 216 disposed on and/or within one or more layers of the substrate 214 and/or other elements of the display panel 210 via traces disposed on or within one or more layers of the substrate 214.

Each of the connections 310 and 312 may be coupled to a bond pad of the DDIC chip 222 and the interposer 230. Further, each of the connections 310 and 312 may be formed by reflowing a solder ball to form the connections 310 and 312. In various embodiments, each of the connections 316 and 318 may be coupled to a bond pad of the interposer 230 and the substrate 214. Further, each of the connections 316 and 318 may be formed by reflowing a solder ball to form the connections 316 and 318. In one or more embodiments, each of the connections 316 comprises one or more bumps of one or more conductive materials. The conductive materials may include gold, tin, or coper, among others. In other embodiments, the connections 316 comprise one or more conductive adhesives. In one embodiment, the DDIC chip 222 is coupled to the interposer 230 via connections 310 and 312 before the interposer 230 is coupled to the substrate 214 via connections 316 and 318. In another embodiment, the DDIC chip 222 is coupled to the interposer 230 via connections 310 and 312 after the interposer 230 is coupled to the substrate 214 via connections 316 and 318.

The interposer 230 includes connections 320 that couple the DDIC chip 222 with the substrate 214. For example, connections 320$a$ couple the connections 310 with the connections 318. Further, connections 320$b$ couple the connections 312 with the connections 316.

In one embodiment, one or more of the connections 320 include one or more vias (e.g., vias 321, 323) coupling one or more traces (e.g. traces 322) formed within one or more metal layers (e.g., an intermediate distribution conductive layer) of the interposer 230 with connections 310 or 312 and connections 318 or 316. For example, the connection 320$a_1$ may include via 321$a_1$, trace 322$a_1$, and via 323$a_1$. The via 321$a_1$ connects the trace 322$a_1$ with one of the connections 310 and the via 323$a_1$ connects the trace 322$a_1$ with one of the connections 318. Further, the connection 320$a_2$ may include via 321$a_2$, trace 322$a_2$, and via 323$a_2$. The via 321$a_2$ connects the trace 322$a_2$ with one of the connections 310 and the via 323$a_2$ connects the trace 322$a_2$ with one of the connections 318. The connection 320$a_3$ may include via 321$a_3$, trace 322$a_3$, and via 323$a_3$. The via 321$a_3$ connects the trace 322$a_3$ with one of the connections 310 and the via 323$a_3$ connects the trace 322$a_3$ with one of the connections 318.

In one embodiment, the connection 320$b_1$ may include via 321$b_1$, trace 322$b_1$, and via 323$b_1$. The via 321$b_1$ connects the trace 322$b_1$ with one of the connections 312 and the via 323$b_1$ connects the trace 322$b_1$ with one of the connections 316. Further, the connection 320$b_2$ may include via 321$b_2$, trace 322$b_2$, and via 323$b_2$. The via 321$b_2$ connects the trace 322$b_2$ with one of the connections 312 and the via 323$b_2$ connects the trace 322$b_2$ with one of the connections 316. The connection 320$b_3$ may include via 321$b_3$, trace 322$b_3$, and via 323$b_3$. The via 321$b_3$ connects the trace 322$b_3$ with one of the connections 312 and the via 323$b_3$ connects the trace 322$b_3$ with one of the connections 316.

In one embodiment, one or more of the connections 320 may include a via that forms a direct connection between one of the connections 310 and one of the connections 318, omitting a trace formed within one or more metal layers of the interposer 230. Further, in one or more embodiments, one or more of the connections 320 may include a via that forms a direct connection between one of the connections 312 and one of the connections 316, omitting a trace formed within one or more metal layers of the interposer 230. In one or more embodiments, at least one of the connections 320 includes more than two vias and more than one trace in more than one metal layer of the interposer 230.

In one embodiment, the DDIC 340 has a height 340 of about 100 um or less. Further, the interposer 220 has a height 342 of about 200 um or less. In various embodiments, the combined height of the DDIC chip 222 and the interposer 230 is about 250 um or less.

FIG. 4 is a schematic bottom view of a portion of the DDIC chip 222, according to one or more embodiments. The DDIC chip 222 includes bonding pads 410 and 412. The bonding pads 410 may be coupled to output circuitry of the DDIC chip 222. For example, the bonding pads 410 may be coupled to source drivers of the DDIC chip 222. Further, the DDIC chip 222 may have any number of the bonding pads 410. For example, the number of the bonding pads 410 may be in the hundreds or thousands. As depicted in FIG. 4, the bonding pads 410 are arranged in a common row. However, in other embodiments, the bonding pads 410 may be arranged in any number of rows. Further, one or more of the rows may be offset from the other, such that the center of a bonding pad 410 of a first row is not aligned with a center of a bonding pad 410 of another row.

In one or more embodiments, the bonding pads 410 may be disposed such that the bonding pads of a common row have a common pitch. For example, the bonding pads 410 may have a pitch of 420 in the range of about 10 um to about 60 um.

The bonding pads 412 may be coupled to a receiver interface of the DDIC chip 222. Further, the DDIC chip 222 may have any number of the bonding pads 412. In various embodiments, the number of bonding pads 412 is less than the number of bonding pads 410. As depicted in FIG. 4, the bonding pads 412 are arranged in a common row. However, in other embodiments, the bonding pads 412 may be arranged in any number of rows. Further, one or more of the rows may be offset from the other, such that the center of a bonding pad 412 of a first row is not aligned with a center of a bonding pad 412 of another row.

The bonding pads 412 may be disposed such that the bonding pads of a common row have a common pitch. For example, the bonding pads 412 may have a pitch of 422 in the range of 40 um to 250 um. Further, in one or more embodiments, the pitch 422 is greater than the pitch 420.

In various embodiments, each of the connections 310 of FIG. 3 corresponds to a coupling between one of the bonding pads 410 and a corresponding bonding pad of the interposer 230. Further, each of the connections 312 of FIG. 3 corresponds to a coupling between one of the bonding pads 412 and a corresponding bonding pad of the interposer 230.

FIG. 5 is a schematic bottom view of a portion of a bottom of the interposer 230, according to one or more embodiments. The interposer 230 includes bonding pads 510 and 512. The interposer 230 may have any number of the bonding pads 510. In one embodiment, number of bonding pads 510 is at least as large as the number of bonding pads 410 of the DDIC chip 222. Further, the bonding pads 510 may be disposed in one or more rows. In various embodiments, the number of rows of the bonding pads 510 may be greater than, less than, or equal to the number of rows of the bonding pads 410.

In various embodiments, the bonding pads 510 have pitch 520. The pitch 520 is at least as large as the pitch 420. In other embodiments, the pitch 520 is greater than the pitch 420. For example, the pitch 520 may be greater than 15 um or greater than 20 um. In one or more embodiments, the pitch 520 is the same as the pitch 219 of the data lines 216 of FIG. 2. Accordingly, each of the bonding pads 510 may be aligned with one or more of the data lines 216. As such, the data lines 216 may couple to the bonding pads 510 via the connections 316 without utilizing a fan-out region where the pitch of the data lines 216 is decreased. Additionally, utilizing an interposer 230 having bonding pads 510 with the pitch 520 decreases the likelihood of manufacturing defects when manufacturing the display device 200 as the larger pitch allows for increased tolerance and greater flexibility when mounting the interposer 230 to the substrate 214. Accordingly, the corresponding cost of manufacturing the display device 200 is decreased.

The location, pitch and/or orientation of the bonding pads 510 may vary depending on the location, pitch and/or orientation of the data lines 216. For example, as the bonding pads 510 may be disposed such that the pitch 520 is similar to the pitch 219 of FIG. 2. Further, the bonding pads 510 may be disposed such the location of at least one bonding pad 510 corresponds to a location of one of the data lines 216 of FIG. 2. Additionally, the interposer 230 may include bonding pads (not shown) having a location, size and/or orientation corresponding to the location, size, and/or orientation of the bonding pads 410 of the DDIC chip 222 of FIG. 4. For example, two or more of the bonding pads on the top of the interposer 230 may have an orientation similar to that of the orientation of the bonding pads 410 and a pitch similar to that of the pitch 420.

The interposer 230 further includes bonding pads 512. In various embodiments, the interposer 230 may have any number of the bonding pads 512. In one embodiment, number of bonding pads 512 is at least as large as the number of bonding pads 412 of the DDIC chip 222. Further, the bonding pads 512 may be disposed in one or more rows. In various embodiments, the number of rows of the bonding pads 512 may be greater than, less than, or equal to the number of rows of the bonding pads 412.

In various embodiments, the bonding pads 512 have a pitch 522. The pitch 522 is at least as large as the pitch 422. In other embodiments, the pitch 522 is greater than the pitch 422. Further, the pitch 522 may be greater than the pitch 520.

The location, pitch and/or orientation of the bonding pads 512 may vary depending on the location, pitch and/or orientation of traces of a connector or the substrate 214. Additionally, the interposer 230 may include two or more bonding pads (not shown) having a location, size and/or orientation corresponding to the location, size, and/or orientation of the bonding pads 412 of the DDIC chip 222 of FIG. 4. For example, two or more of the bonding pads on the top of the interposer 230 may have an orientation similar to that of the orientation of the bonding pads 412 and a pitch similar to that of the pitch 422.

In one embodiment, each of the connections 318 of FIG. 3 corresponds to a coupling between one of the bonding pads 512 and a corresponding bonding pad on top of the substrate 214. Further, each of the connections 316 of FIG. 3 corresponds to a coupling between one of the bonding pads 510 and a corresponding bonding pad on top of the substrate 214.

Further, the connections 316 and 318 may be formed similar to that of connections 312 and 310.

Figure 6:
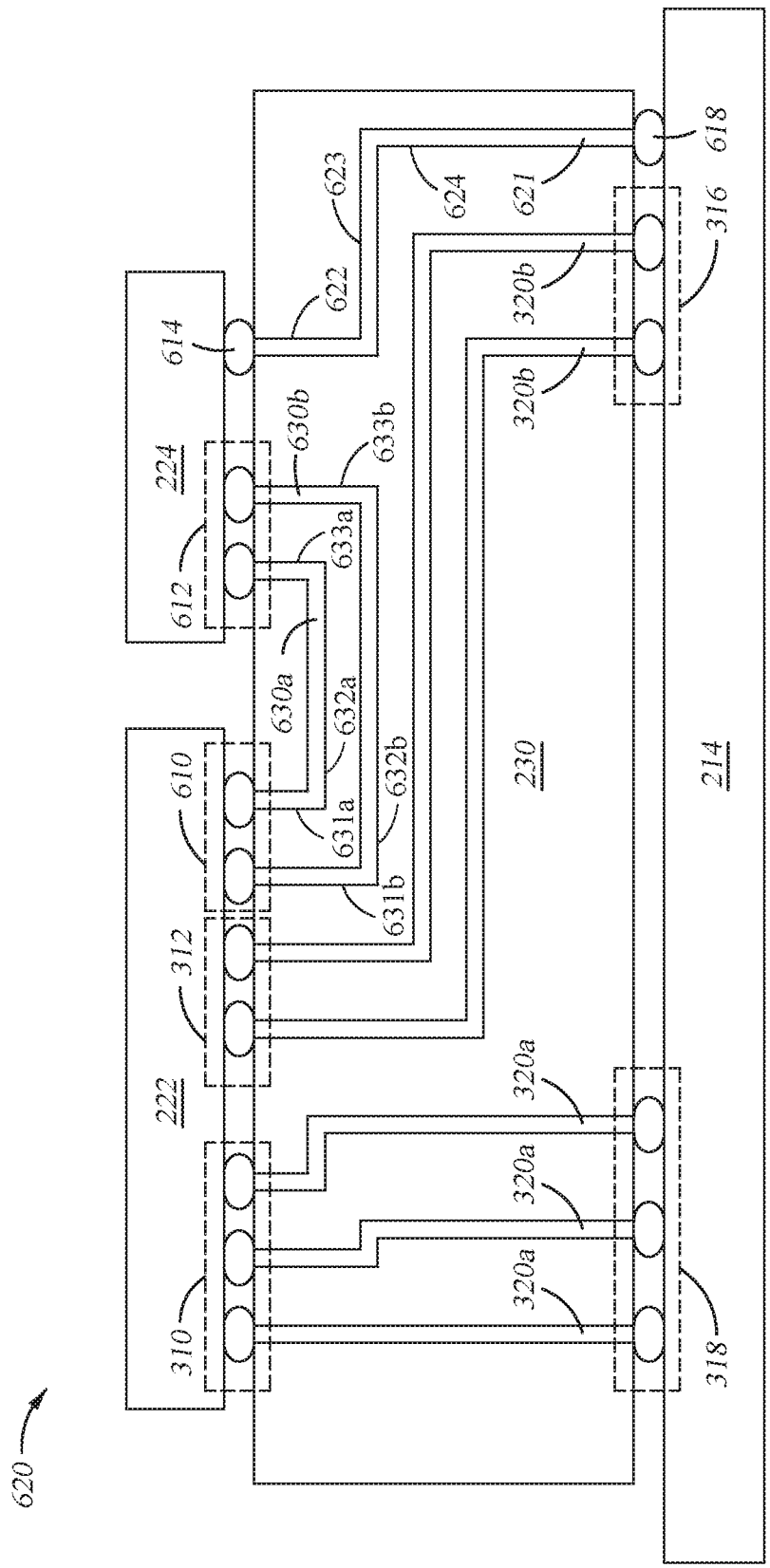
FIG. 6 is a schematic block diagram of an example semiconductor assembly, according to one or more embodiments.

FIG. 6 illustrates an alternative embodiment of the semiconductor assembly 620. In the embodiment of FIG. 6, the DDIC chip 222 and the IC chip 224 are mounted to the interposer 230. Further, connections 310 are formed between the DDIC chip 222 and the interposer 230. Additionally, connections 312 are formed between the DDIC chip 222 and the interposer 230. The connections 310 are coupled to the connections 318 through connections 320a and the connections 312 are coupled to the connections 316 through connections 320b.

In one or more embodiments, the DDIC chip 222 is communicatively coupled with the IC chip 224 via connections 610, connections 612 and connections 630 comprising one or more vias and one or more traces formed within one or more metal layers of the interposer 230. For example, the connection 630a may include vias 631a and 633a and trace 632a. Further, the connection 630b may include vias 631b and 633b and trace 632b. Further, the IC chip 224 may be coupled to one or more traces disposed of the substrate 214. For example, the IC chip 224 may be coupled to the interposer with connection 614 and the interposer 230 may be coupled with the substrate 214 with connection 618. Further, the connection 614 is coupled to the connection 618 with connection 621. The connection 621 may include vias 622 and 624 and trace 623. In one or more embodiments, the connections 614, 618 and the connection 621 may be omitted. In other embodiments, one or more of the connections 610, 612 and 630 may be omitted. Further, while two connections 610, two connections 612, and two connections 630 are depicted, in other embodiments, more than two connections 610, more than two connections 612, and more than two connections 630 may be utilized. Further, in one or more embodiments, while a single connection 614, a single connection 618 and a single connection 621 are illustrated, more than a single connection 614, a single connection 618 and a single connection 621 may be utilized. In one embodiment, the connection 621 may be formed from a single via and omit traces.

In one or more embodiments, more than two IC chips, e.g., DDIC chip 222 and the IC chip 224 may be mounted to the interposer 230. In one or more embodiments, a first IC chip may be mounted on the interposer 230 and coupled to traces of the substrate 214 through corresponding connections. Further, a second IC chip may be mounted to the interposer 230 and coupled to the first IC chip through corresponding connections, vias and metal layers of the interposer 230. The second IC chip may or may not be coupled to traces of the substrate 214 through corresponding connections. Additionally, a third IC chip may be mounted to the interposer 230. The third chip may be communicatively coupled to first IC chip through corresponding connections and metal traces within the interposer 230. Further, the third chip may be communicatively coupled to the second IC chip through corresponding connections, vias and metal traces within the interposer 230. Additionally, the third chip may be communicatively coupled with traces of the substrate 214 through corresponding connections. Further, additional IC chips may be coupled to other IC chips and/or traces of the substrate 214 as described above.

Figure 7:
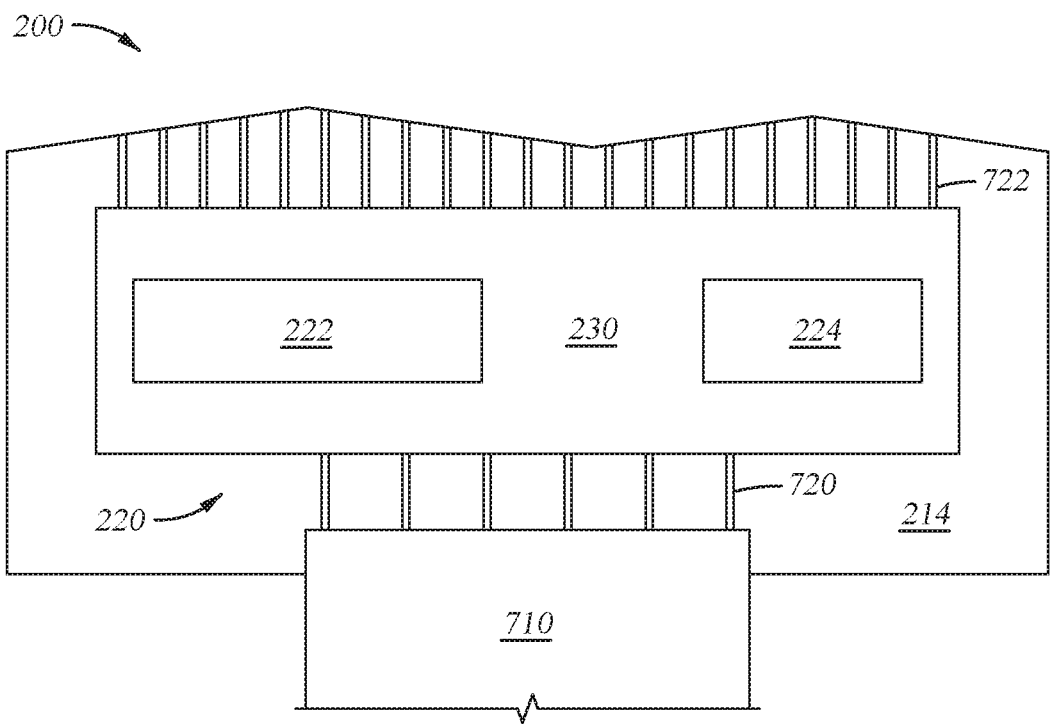
FIGS. 7 and 8 are schematic block diagrams of a portion of a display device, according to one or more embodiments.

FIG. 7 illustrates a top schematic view of the display device 200, according to one or more embodiments. In the embodiment of FIG. 7, the DDIC chip 222 is mounted to the interposer 230 and the interposer 230 is mounted to the substrate 214. In various embodiments, one or more additional IC chips 224 are also mounted to the interposer 230.

Further, a connector 710 is mounted to the substrate 214. The connector 710 may be a flexible connector. For example, the connector 710 may be a flexible printed circuit board (FPC). Further, the connector 710 may include one or more layers. For example, the connector 710 may include two or more layers. In one embodiment, the connector 710 includes one or more traces that are coupled to a processor of the input device 100.

The connector 710 couples to traces 720 disposed in one or more layers of the substrate 214. The traces 720 are coupled to the interposer 230 via one or more connections. For example, the traces 720 are couple to the interposer 230 via connections 318.

The interposer 230 is coupled to the traces 722 through one or more connections. For example, the interposer 230 is coupled to the traces 722 through connections 316. The traces 722 may be disposed on or within one or more layers of the substrate 214. Further, the traces 722 may be coupled to the data lines 216. In one embodiment, the traces 722 are the data lines 216.

Figure 8:
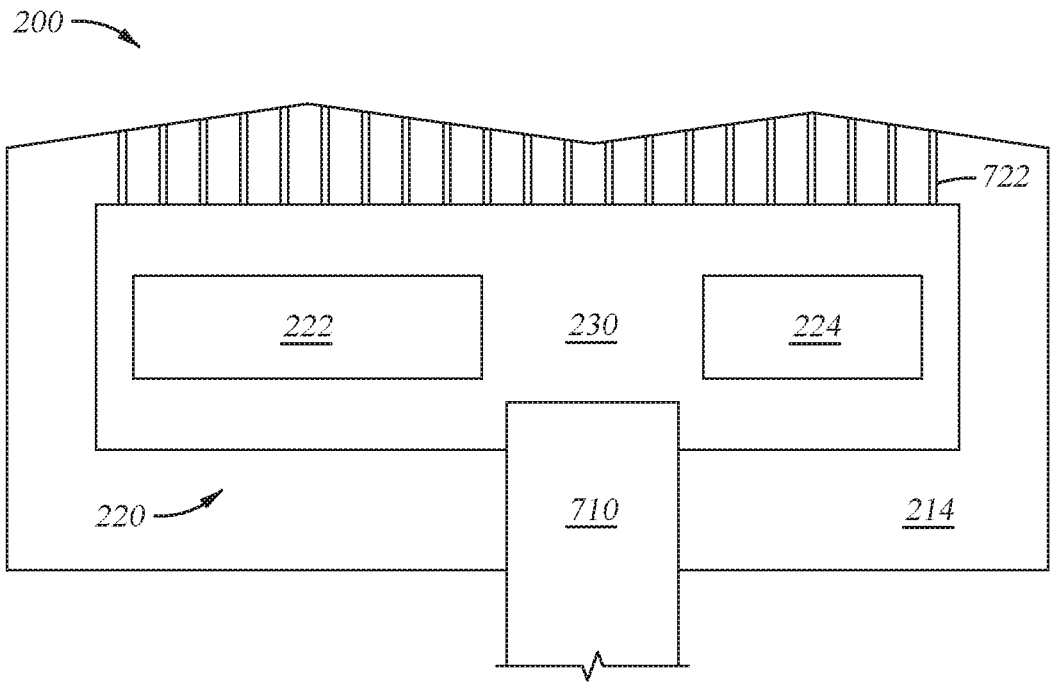

FIG. 8 illustrates a top schematic view of the display device 200, according to one or more embodiments. In the embodiment of FIG. 8, the DDIC chip 222 is mounted to the interposer 230 and the interposer 230 is mounted to the substrate 214. In various embodiments, one or more additional IC chips 224 are also mounted to the interposer 230. Further, the connector 710 is mounted to the interposer 230.

The connector 710 is coupled with vias and/or metal layers within the interposer 230 to one or more of the DDIC chip 222, the IC chip 224, and traces 722 of the substrate 214. The connector 710 and at least one of the DDIC 22 and the IC chip 224 are coupled to a common surface of the interposer 230.

In one embodiment, the resistance of the connection between the connector 710 and the interposer 230 of FIG. 8 is less than the resistance of the connection between the connector 710 and the interposer 230 of FIG. 7.

FIG. 9 illustrates a portion of the display device 200, according to one or more embodiments. In the embodiment of FIG. 9, the DDIC chip 222 is mounted to the interposer 230 forming semiconductor assembly 220 and the interposer 230 is mounted to the substrate 214. Further, a processor 910 is mounted to the substrate 214. The processor 910 may be any processor of the input device 100. In various embodiments, the processor 910 may be omitted. Further, the substrate 214 is flexible and the portion of the substrate 214 that the interposer 230 and the DDIC chip 222 are mounted to is folded under at least a portion of the display panel 210.

FIG. 10 illustrates a portion of the display device 200, according to one or more embodiments. In the embodiment of FIG. 10, the DDIC chip 222 is mounted to the interposer 230 forming semiconductor assembly 220 and the interposer 230 is mounted to the substrate 214. Further, the processor 910 is mounted to the substrate 214. In various embodiments, the processor 910 may be omitted. Further, the substrate 214 is flexible and the portion of the substrate 214 that the interposer 230 and the DDIC chip 222 are mounted to is not folded and the portion of the substrate that the processor 910 is mounted is folded under at least a portion of the display panel 210. In one embodiment, a stiffener may be positioned under the substrate 214 in at least the region where the interposer 230 and the DDIC chip 222 are mounted to the substrate.

Figure 11:
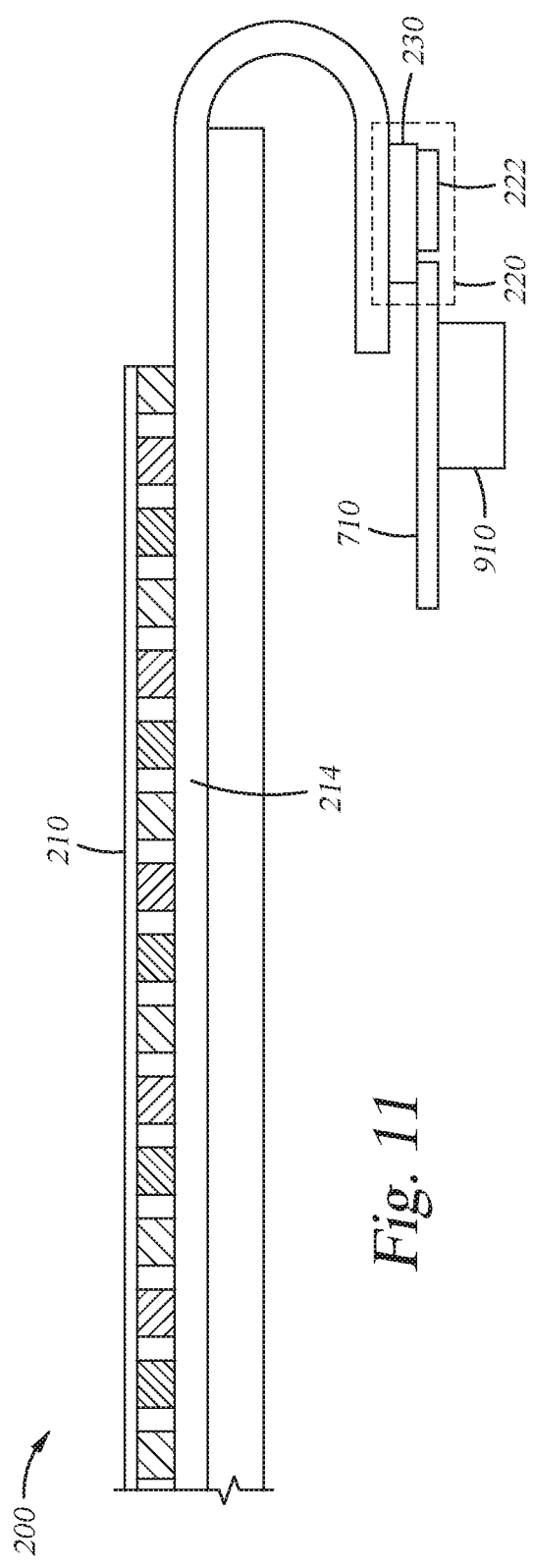

FIG. 11 illustrates a portion of the display device 200, according to one or more embodiments. In the embodiment of FIG. 11, the DDIC chip 222 is mounted to the interposer 230 forming semiconductor assembly 220 and the interposer 230 is mounted to the substrate 214. Further, the substrate 214 is flexible and the portion of the substrate 214 that the interposer 230 and the DDIC chip 222 are mounted to is folded under at least a portion of the display panel 210. Further, as is described with regard to FIG. 7, the interposer 230 is coupled to the connector 710. A processor, e.g., the processor 910, may be mounted to the connector 710.

Figure 12:
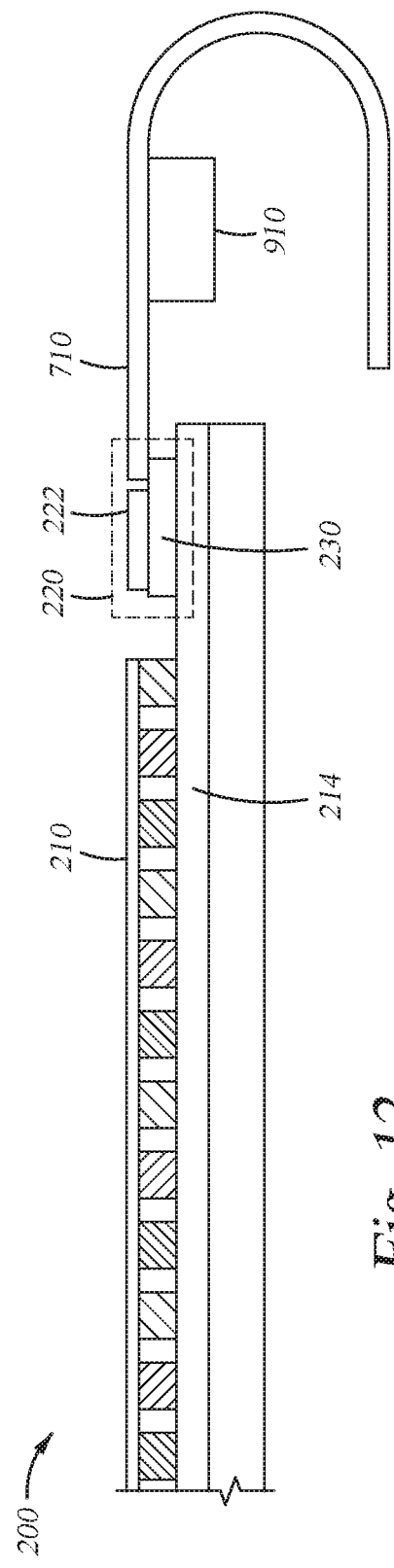

FIG. 12 illustrates a portion of the display device 200, according to one or more embodiments. In the embodiment of FIG. 12, the DDIC chip 222 is mounted to the interposer 230 forming semiconductor assembly 220 and the interposer 230 is mounted to the substrate 214 in a substantially rigid region of the display panel 210. Further, the processor 910 is mounted to the substrate 214. Further, as is described with regard to FIG. 7, the interposer 230 is coupled to connector 710. The flexible connector 710 may be folded under at least a portion of the display panel 210 where it may couple to one or more elements of an input device, e.g., the input device 100.

Figure 13:
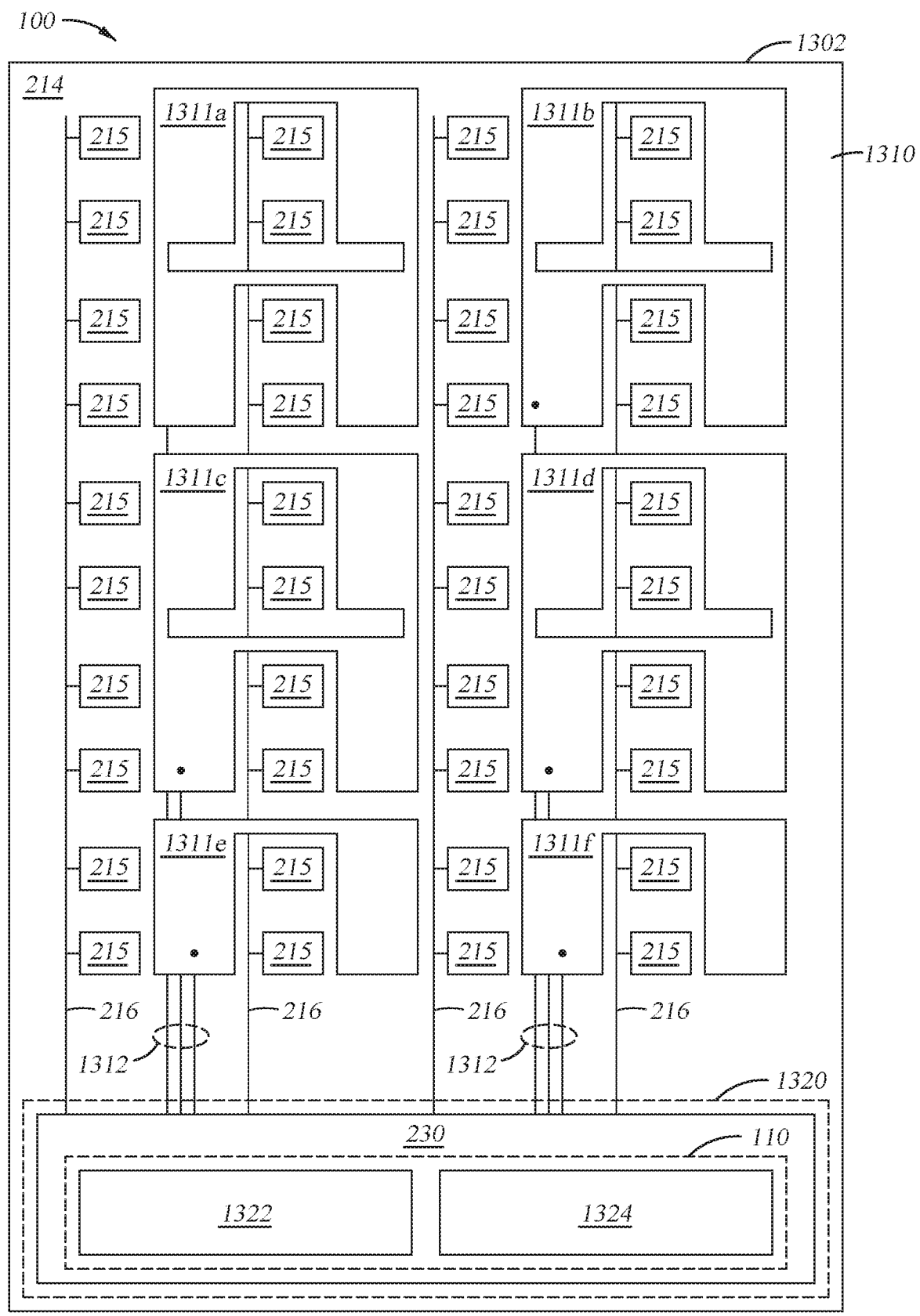
FIG. 13 is a schematic block diagram of an input device, according to one or more embodiments.

FIG. 13 illustrates an embodiment of the input device 100, according to one or more embodiments. As depicted in FIG. 13, the input device 100 includes display device 1302. The display device 1302 includes a display panel 1310. As compared to the display panel 210, the common electrodes 1311 of the display panel 1310 are configured to be utilized for both display updating and capacitive sensing (e.g. may be connected to a subset of data lines for sensing). For example the common electrodes 1311 may be segmented to form sensor electrodes 1311a, 1311b, 1311c, 1311d, 1311e and 1311f for proximity or input sensing. In another embodiment sensor electrodes (e.g. patterned and aligned to the subpixels 215 of the display panel 210) may be patterned and segmented for capacitive proximity sensing similar to that of sensor electrodes 1311a-1311f. In such an embodiment, the sensor electrodes may be formed from metal mesh. Further, the sensor electrodes may be disposed on a common substrate of the display panel 210 (e.g., a lens of the display panel 210, or an encapsulation layer of the display panel 210) in a display integrated input sensing device. Alternatively, the sensor electrodes may be disposed on a substrate that is adhered to the display panel 210. Further, a single layer of routing (e.g., the data lines 216) may be utilized to connect with the sensor electrodes in the active region 212 of the display device 200.

In one or more embodiments, a display device (e.g., the display device 1302) that includes sensor electrodes (e.g., the sensor electrodes 1311) that are either also configured for display updating or disposed on a common substrate of the display panel of the display device (e.g., the lens or encapsulation layer), may be referred to as a display integrated proximity or input sensing device. Further, the display device 1302 may include optical sensing elements in addition to the capacitive sensor electrodes 1311. In one or more embodiments, the sensing electrodes may be routed parallel to the data lines and output pads for sensing may be placed on the display panel with the data lines 216 for display integrated proximity sensing.

In various embodiments, the semiconductor assembly 1320 includes the interposer 230 and one or more of IC chips 1322, 1324. In one embodiment, the semiconductor assembly 1320 includes the IC chip 1322 which may be configured as a display driver IC chip similar to that of the DDIC chip 222. Further, the semiconductor assembly 1320 includes the IC chip 1324. The IC chip 1324 may be configured to operate the sensor electrodes 1311a-1311f for capacitive sensing. For example, the IC chip 1324 may be a capacitive sensing IC chip.

In another embodiment, the semiconductor assembly 1320 includes the IC chip 1322, which may be configured for display updating and capacitive sensing. For example, the IC chip 1322 may be configured similar to that of the DDIC chip 222 for display updating and also configured to operate the sensor electrodes 1311a-1311f for input sensing. In such an embodiment, the IC chip 1322 may be referred to as a touch and display driver integration (TDDI) IC chip. Further, the semiconductor assembly 1320 may include the IC chip 1324 which may be a memory device. Alternatively, the IC chip 1322 may be configured to receive, transmit and process data for at least one of display updating and input sensing and the IC chip 1324 may be configured to drive and receive signals for at least one of display updating and input sensing. In various embodiments, the semiconductor assembly 1320 may include additional IC chips not depicted in FIG. 13.

In one or more embodiments, the IC chip 1322 and/or the IC chip 1324 may be mounted to the interposer 230 similar to that of the DDIC chip 222 and the IC chip 224. Further, the sensor electrodes 1311a-1311f may be coupled to the semiconductor assembly 1320 via traces 1312.

In one or more embodiments, the sensor electrodes 1311a-1311f may be driven for capacitive sensing. In such embodiments, the IC chip 1322 may include sensor circuitry that is configured to drive the sensor electrodes 1311a-1311f for capacitive sensing. In one embodiment, the sensor circuitry configured to drive a transmitter signal onto first ones of sensor electrodes 1311a-1311f and receive resulting signals from other one of the sensor electrodes 1311a-1311f. In another embodiment, the IC chip 1322 is configured to drive an absolute capacitive sensing signal onto the sensor electrodes 1311a-1311f and receive resulting signals from the sensor electrodes 1311a-1311f for absolute capacitive sensing.

In other embodiments, sensor electrodes separate from the electrodes of the display panel 1310 may be utilized for capacitive sensing in addition to, or alternatively to using the sensor electrodes 1311a-1311f for capacitive sensing. In such embodiments, the additional sensor electrodes may be disposed on one or more substrates of the display device 1302 or on one or more substrates that are adhered to the display device 1302.

In various embodiments, the sensor electrodes 1311a-1311f may be disposed on a common layer as the electrodes of the subpixels 215. In such embodiments, the display panel 1310 may be one of an in-plane switching (IPS) display pane, and a fringe field switching (FFS) display panel, among others. Alternatively, the sensor electrodes 1311a-1311f may be disposed on a layer separate from the electrodes of the subpixels 215. In such embodiments, the display panel 1310 may be a vertical alignment (VA) display panel.

The sensor electrodes 1311a-1311f may be any shape and size. For example, the sensor electrodes 1311a-1311f may have a substantially square shape as shown. Alternatively, the sensor electrodes 1311a-1311f may have a substantially rectangular shape or an elliptical shape, among others. Further, the sensor electrodes 1311a-1311f may include one or more protrusions and/or one or more recesses. Additionally, or alternatively, the sensor electrodes 1311a-1311f may be interdigitated with each other. Further, while the sensor electrodes 1311a-1311f are illustrated as having a size that corresponds to two subpixels by four subpixels, in other embodiments, the sensor electrodes 1311a-1311f may have a size NxM, where N and M are any integers greater than 1.

In one embodiment, the input device 100 includes hundreds of sensor electrodes 1311a-1311f.

In one or more embodiments, "mutual capacitance" (also often referred to as "transcapacitance") sensing methods are based on changes in the capacitive coupling between sensor electrodes. For example, mutual capacitance sensing methods may be based on changes in capacitive couple between the sensor electrodes 1311a-1311f, or between one or more of the sensor electrodes 1311a-1311f and one or more other sensor electrodes not illustrated in FIG. 13. In various embodiments, an input object, e.g., input object 140, near the sensor electrodes alters the electric field between the sensor electrodes, thus changing the measured capacitive coupling. In one embodiment, a transcapacitive sensing method operates by detecting the capacitive coupling between one or more sensor electrodes 1311a-1311f (also referred to herein as "transmitter sensor electrodes" or "transmitter electrodes") and one or more other sensor electrodes 1311a-1311f or other sensor electrodes not illustrated (also referred to herein as "receiver sensor electrodes" or "receiver electrodes"). Transmitter electrodes may be modulated relative to a reference voltage, e.g., system ground, and/or a receiver electrode to transmit transmitter signals. Receiver electrodes may be held substantially constant relative to the reference voltage or modulated differently than the transmitter electrodes to facilitate receipt of resulting signals. A resulting signal may comprise effect(s) corresponding to one or more transmitter signals, and/or to one or more sources of environmental interference, e.g. other electromagnetic signals. The sensor electrodes may be dedicated transmitter electrodes or receiver electrodes, or may be configured to both transmit and receive. In one or more embodiments, the transmitter signal is modulated and contains one or more bursts over a period of time allocated for input sensing. The transmitter signal may have an amplitude, frequency and voltage which may be changed to obtain more robust location information of the input object in a sensing region.

In one embodiment, "self-capacitance" (also often referred to as "absolute capacitance") sensing methods are based on changes in the capacitive coupling between the sensor electrodes 1311a-1311f and an input object. In various embodiments, an input object near the sensor electrodes 1311a-1311f alters the electric field near the sensor electrodes, thus changing the measured capacitive coupling. In one implementation, an absolute capacitance sensing method operates by modulating the sensor electrodes 1311a-1311f with respect to a reference voltage, e.g., system ground, and by detecting the capacitive coupling between the sensor electrodes and input objects. In one embodiment, the IC chip 1322 drives an absolute capacitive sensing signal onto the sensor electrodes 1311a-1311f to perform absolute capacitive sensing. In one embodiment, the absolute capacitive sensing signal is the same or different from the transmitter signal used in transcapacitance sensing.

In one or more embodiments, the sensor circuitry of the IC chip 1322 comprises transmitter circuitry and/or receiver circuitry. The transmitter and/or receiver circuitry may include a plurality of analog front ends (AFEs) and/or one or more drivers. Each of the AFEs may include elements such as amplifiers (e.g. a charge amplifier with an integrating capacitor) with a high pass mechanism (e.g. a reset switch or a feedback resistor) along with one or more demodulators (e.g. analog sampling or digital mixing) and/or a low pass filter (e.g. FIR or IIR) before or integrated with an ADC converter to report sensed signals and provide digital results.

In one or more embodiments, capacitive sensing and display updating occur during at least partially overlapping periods. As mentioned earlier, display updating may occur during a display frame. During each display frame, each of display line of the display device may be updated. In one embodiment, a display frame may be updated once every 16 ms or at a display frame rate of 60 Hz. In other embodiments, other display frame rates may be utilized. For example, display frame rates of 48 Hz, 120 Hz, 180 Hz, 220 Hz, and 240 Hz, among others, may be utilized. Further, in some embodiments, as one or more of the sensor electrodes 1311a-1311f is driven for display updating, the one or more sensor electrodes the sensor electrodes 1311a-1311f may also be driven for capacitive sensing. Overlapping capacitive sensing and display updating may include modulating the reference voltage(s) of the display device and/or modulating at least one of the sensor electrodes 1311a-1311f for a display in a time period that at least partially overlaps with when the sensor electrodes are configured for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display line update period. In such an embodiment, the non-display update period may be referred to as a long horizontal blanking period, long h-blanking period or a distributed blanking period. In other embodiments, the non-display update period may comprise horizontal blanking periods and vertical blanking periods. The IC chip 1322 may be configured to drive sensor electrodes for capacitive sensing during any one or more of or any combination of the different non-display update times.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:
1. A display device comprising:
a display panel comprising:
 a plurality of subpixels defining an active region of the display panel;
 a substrate; and
 a plurality of data lines disposed within one or more layers of the substrate and coupled the plurality of subpixels; and
a semiconductor assembly comprising:
 a display driver integrated circuit (DDIC) chip comprising a plurality of output pads and a plurality of input pads; and
 an interposer coupled to the DDIC chip, mounted to the substrate and comprising:
  a plurality of output pads coupled to the plurality of output pads of the DDIC chip and to the plurality of data lines; and
  a plurality of input pads coupled to the plurality of input pads of the DDIC chip, wherein a width of the interposer is at least as large as a distance between outermost data lines of the plurality of data lines.

2. The display device of claim 1, wherein the width of the interposer is at least about 32 mm.

3. The display device of claim 2, wherein an aspect ratio of the interposer is at least about 30 to about 1.

4. The display device of claim 1, wherein the width of the interposer is at least as large as a width of the active region.

5. The display device of claim 1 further comprising:
a connector coupled to the substrate, and communicatively coupled with the interposer.

6. The display device of claim 1 further comprising:
a connector mounted to the interposer, wherein the DDIC chip and the connector are mounted to a common surface of the interposer.

7. The display device of claim 1, wherein a pitch of the plurality of output pads of the DDIC chip differs from a pitch of the plurality of output pads of the interposer.

8. The display device of claim 7, wherein the pitch of the plurality of output pads of the DDIC chip is smaller than the pitch of the plurality of output pads of the interposer.

9. The display device of claim 7, wherein the pitch of the plurality of output pads of the interposer is similar to a pitch of the plurality of data lines.

10. The display device of claim 9, wherein the pitch of the plurality of data lines is substantially constant.

11. The display device of claim 1, the DDIC chip further comprises sensing circuitry configured to acquire resulting signals from one or more sensor electrodes.

12. The display device of claim 11, wherein the sensing circuitry is coupled to the one or more sensor electrodes via one or more of the plurality of data lines.

13. The display device of claim 1 further comprising sensor electrodes disposed on a substrate of the display panel.

14. A semiconductor assembly comprising:
a display driver integrated circuit (DDIC) chip comprising a plurality of output pads and a plurality of input pads, the DDIC chip is configured to drive a plurality of data lines of a display device to update an active region of the display device; and
an interposer coupled to the DDIC chip and comprising:
 a plurality of output pads coupled to the plurality of output pads of the DDIC chip and configured to be coupled to the plurality of data lines of the display device; and
 a plurality of input pads coupled to the plurality of input pads of the DDIC chip pads, wherein a width of the interposer is at least as large as a distance between outermost data lines of the plurality of data lines.

15. The semiconductor assembly claim 14, wherein the width of the interposer is at least one of about 32 mm and at least as large as a width of the active region.

16. The semiconductor assembly of claim 15, wherein an aspect ratio of the interposer is at least about 30 to about 1.

17. The semiconductor assembly of claim 14, wherein a pitch of the plurality of output pads of the DDIC chip is smaller than a pitch of the plurality of output pads of the interposer, and wherein the pitch of the plurality of output pads of the interposer is similar to a pitch of the plurality of data lines.

18. An interposer for a display device, the interposer comprising:
a plurality of output pins configured to:
 couple to a plurality of output pads of a display driver integrated circuit (DDIC) chip, wherein the DDIC chip is configured to drive a plurality of data lines to update an active region of a display device; and couple to the plurality of data lines of the display device; and a plurality of input pads configured to couple to a plurality of input pins of the DDIC chip, wherein a width the interposer is at least as large as large as a distance between outermost data lines of the plurality of data lines.

19. The interposer of claim 18 further comprising a width of at least about 32 mm and an aspect ratio of at least about 30 to about 1.

20. The interposer of claim 18, wherein a pitch of the plurality of output pads of the interpose is larger than a pitch of the plurality of output pads of the DDIC chip and the pitch of the plurality of output pads of the interposer is similar to a pitch of the plurality of data lines.

\* \* \* \* \*